United States Patent [19]

Allen et al.

[11] 4,218,758

[45] Aug. 19, 1980

[54] PARALLEL-TO-SERIAL BINARY DATA CONVERTER WITH MULTIPHASE AND MULTISUBPHASE CONTROL

[75] Inventors: Francis K. Allen; Victor H. Chin, both of San Jose, Calif.

[73] Assignee: International Business Machines Corporation, Armonk, N.Y.

[21] Appl. No.: 921,141

[22] Filed: Jun. 30, 1978

[51] Int. Cl.² .................................................. G06F 5/04
[52] U.S. Cl. ................................. 364/900; 235/92 CV
[58] Field of Search ... 364/200 MS File, 900 MS File; 328/37; 235/92 CV, 92 SH; 365/83, 219

[56] References Cited

U.S. PATENT DOCUMENTS

| | | | |
|---|---|---|---|
| 3,090,034 | 5/1963 | Fredericks et al. | 364/900 |
| 3,312,948 | 4/1967 | Capozzi | 364/900 |
| 3,417,377 | 12/1968 | Vietor et al. | 364/900 |
| 3,609,391 | 9/1971 | Hatano . | |
| 3,796,961 | 3/1974 | Tripp . | |
| 3,863,226 | 1/1975 | Ryburn | 364/200 |
| 3,898,627 | 8/1975 | Hooker et al. | 364/900 |
| 3,986,046 | 10/1976 | Wunner . | |
| 4,023,144 | 5/1977 | Koenig | 364/900 |

Primary Examiner—Gareth D. Shaw
Assistant Examiner—Thomas M. Heckler
Attorney, Agent, or Firm—Nathan N. Kallman

[57] ABSTRACT

Parallel binary data from a data source are processed for serialization by circuitry including parallel data registers, a clock ring that provides four phases, and a two phase counter which is operated so that the two phases are in quadrature to each other, and each of its two phases changes count value only once for each complete cycle of the four phase clock ring. The counter has two sets of output signals which are used to select pairs of parallel bits in one of two data registers. The selected bits from the data registers are sampled in serial time by a phase clock pulse from the clock ring, interleaved and processed to form a stream of serialized data bits.

7 Claims, 4 Drawing Figures

PARALLEL-TO-SERIAL BINARY DATA CONVERTER WITH MULTIPHASE AND MULTISUBPHASE CONTROL

DESCRIPTION

1. Technical Field

This invention relates to a binary data processing system and in particular to a parallel-to-serial converter employing phase controls.

An object of this invention is to provide a circuit for converting parallel stored binary data to serial data, employing relatively slow circuit elements to process relatively high rates of data at low cost.

Another object of this invention is to provide a high speed data rate processing circuit that is free from switching hazards.

Another object is to provide a binary data parallel-to-serial converter for high speed data rates which maintains precise synchronization while processing data.

2. BACKGROUND ART

Parallel-to-serial binary data converters are extensively used in conjunction with data registers that store binary bits as bytes of data which are serialized for detection and further use. It is apparent that the circuitry utilized between the data store and the serializer output manifest inherent limitations on the rate of handling data, due to characteristics such as settling time of electrical components, for example. Therefore, various systems have been proposed to alleviate such problems. By way of example, two phase systems have been tried in which data bits are sampled during alternating periods. However, two phase systems have not been able to overcome stringent timing problems imposed by high data rates, due to circuit delay time required to allow control and steering circuits to stabilize or settle down before data could be sampled. With three phase systems, the handling of eight bit per byte parallel stored data becomes complex because there is no direct multiple relation between eight bits and three phases and thus logic circuit problems arise. When a four phase system is considered, although the system could handle high data rates, the amount of circuit components required are multiplied accordingly, thereby increasing cost and maintenance.

BRIEF DESCRIPTION OF THE DRAWING

The invention will be described with reference to the drawing in which.

In accordance with this invention, a multiple phase counter and data steering system selects data that is sampled by clock pulses, which define subphases of each multiple phase.

Figure 1:
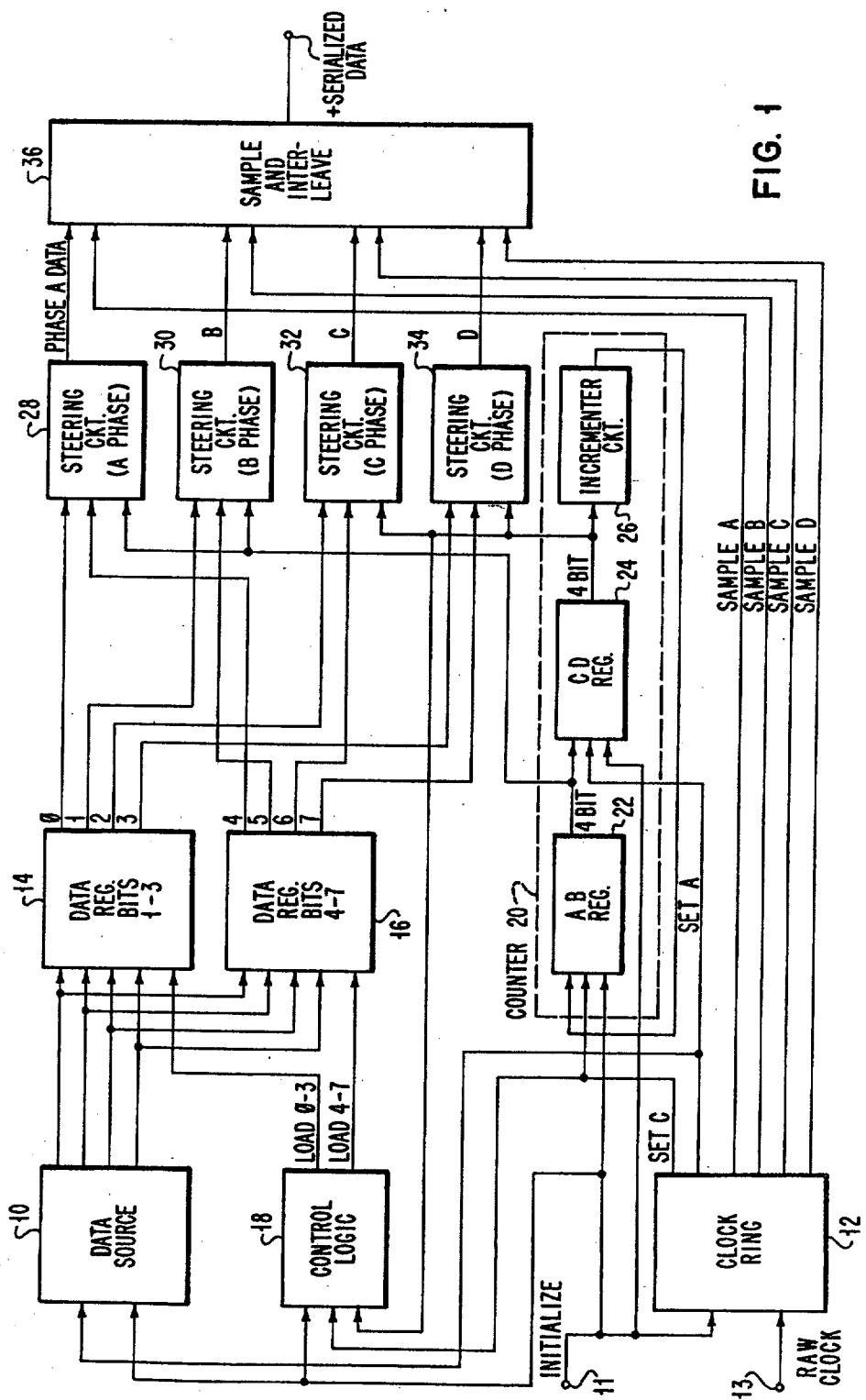
FIG. 1 is a block diagram of a parallel-to-serial converter, in accordance with this invention.

With reference to FIG. 1, a data source 10 provides half-bytes of binary information in a parallel-by-bit, serial-by-half-byte manner, and this information is converted into a fully serialized output data stream by the parallel-to-serial converter of this invention. A half-byte of data is four bits of binary data. The data source 10 may be a central processor, a disk store or other device which stores or generates binary data. To aid in the explanation of this invention, it is assumed that when the data source 10 is pulsed with an "initialize" signal 11, derived, for example, from an external control unit (not shown), or a "set A" clocking signal from a clock ring 12, that a new half-byte of parallel data is made available at the output of the data source 10 and that this data will remain stable until it is loaded into either data register 14 or data register 16.

Each data register 14 or 16 consists of latch circuits which can store, in parallel, one half-byte of data from the data source 10. Data register 14 will be loaded with new data when it senses a "Load 0-3" signal from control logic 18. Data register 16 will be loaded with new data when it senses a "Load 4-7" signal from the control logic 18. The control logic 18 utilizes clocking information, i.e., "set C" from the clock ring 12; steering information "CD Reg bit 4" from a counter 20; and the "initialize" signal 11 to generate the "Load 0-3" and "Load 4-7" signals. These signals are timed such that they cause alternate loading of the data registers 14 and 16. The loading of one data register 14 or 16 is accomplished while the data stored in the other data register is held steady for parallel-to-serial conversion. The "initialize" signal causes the control logic 18 to issue a "Load 0-3" signal and thereby causes the data register 14 to be loaded with the first half-byte of data from the data source 10 prior to the actual start of the serialization process.

Figure 3:
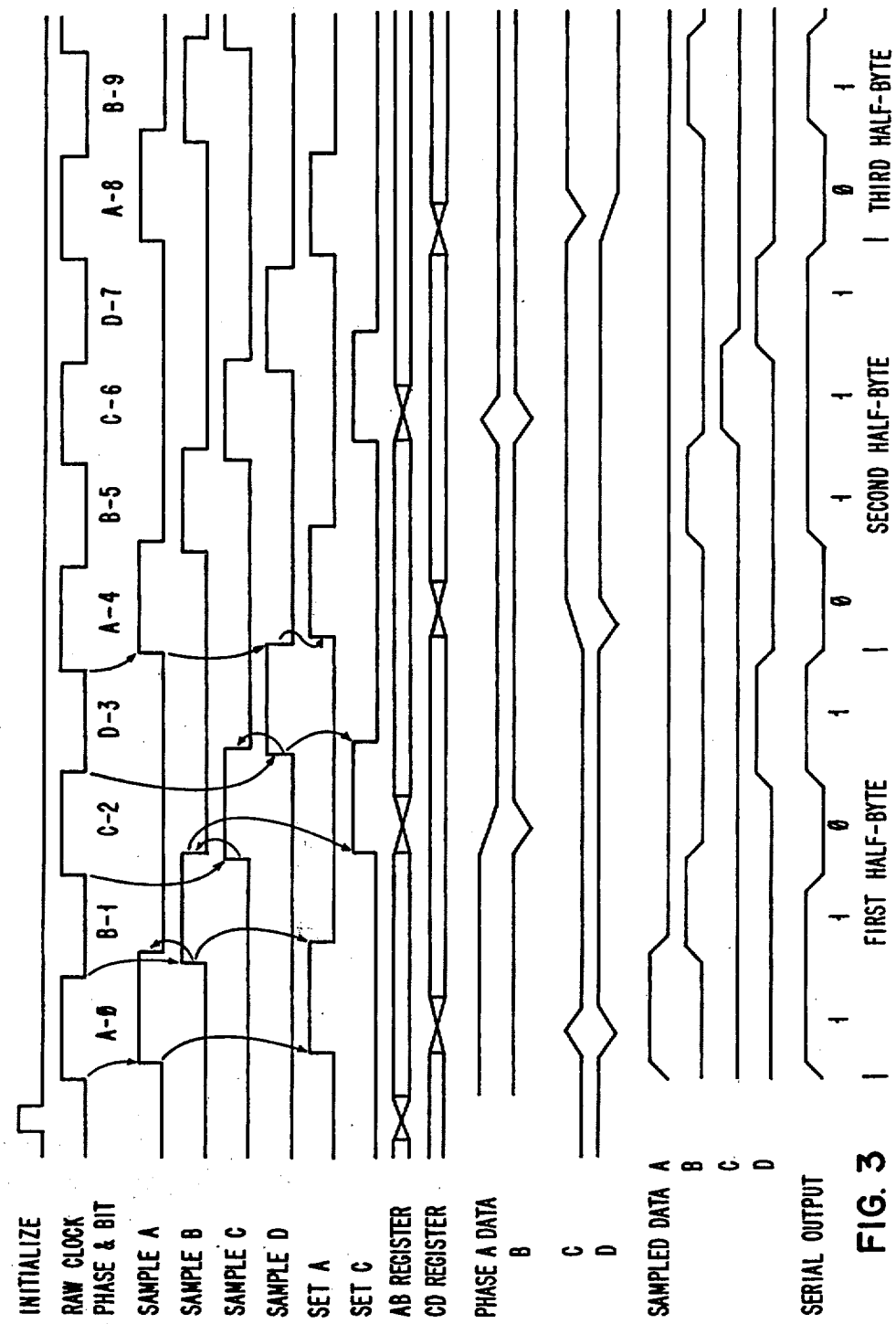
FIG. 3 is a series of timing waveforms illustrating the phase relationships of the processed signals.

In greater detail, and with reference to FIGS. 1 and 3, the parallel-to-serial converter of this invention includes a clock ring 12, which receives a raw clock signal 13 from an external source (not shown). The raw clock signal will control the rate at which data bits are serialized such that one bit is serialized for each alteration of the raw clock signal. The raw clock signal may alternate at a regular or irregular rate according to the requirements of the specific system in which this invention is applied. However, it is illustrated in FIG. 3 as having approximately equal time durations for each alteration.

The clock ring 12 is basically a one-of-four type ring circuit which has two groups of output timing signals. The first group provides four signals called "Sample" outputs ("Sample A", "Sample B", "Sample C", and "Sample D"). These are caused to turn "ON" one at a time, in the cyclic sequence .A.B.C.D.A.B. . . . , each time an alteration of the raw clock signal is detected. As each sample output of the clock ring turns "ON", the new sample current forces the prior one to be turned "OFF" immediately. However, there is a slight timewise overlap of the "ON" sample pulses.

The second group has two outputs called "Set A" and "Set C". "Set A" turns "ON" only after "Sample D" has turned "OFF", and it turns "OFF" at approximately the same time as "Sample A" is turned "OFF", but, in any case, well before "Sample C" is turned "ON". "Set C" has similar timing except that it is displaced by two phases.

The counter 20 includes an AB register 22, a CD register 24, and a incrementing circuit 26 coupled in a closed loop. Parallel binary count information advances through the loop as the AB register 22 and CD register 24 are alternately reloaded by the application of "Set C" and "Set A" pulses respectively. The incrementer circuit 26 causes the binary value of the count to be incremented by 4 each time the AB register 22 is loaded.

In FIG. 1, only the 4 bit of the parallel binary count is shown. Because the clock ring, in effect, counts the values 0, 1, 2, and 3 in the serialization process, there is no need for the generation of binary bits of weights 1 and 2 by the counters. Thus, the lowest order bit produced by the counter is weighted binary 4. Parallel count bits higher than binary 4 are not pertinent to the basic system illustrated in FIG. 1, but may be required in similar type systems having greater complexity.

Steering networks 28, 30, 32, 34 are four functionally similar steering networks that are used for the serialization process. The Phase A data and Phase B data steering networks 28 and 30 are controlled by the AB Register 22 of the counter 20. The Phase C data and Phase D data steering networks 32 and 34 are controlled by the CD Register 24 of the counter 20. Phases A, B, C and D may be considered as subphases. This arrangement permits slower counter operation and requires fewer counter registers than would otherwise be required to obtain the speed of operation required.

Figure 2:
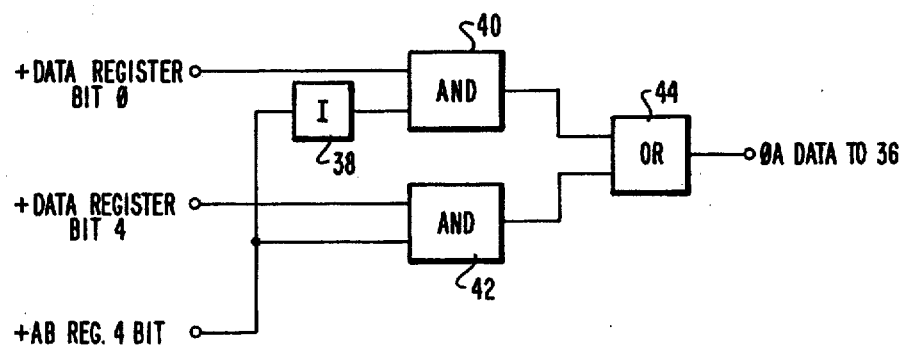
FIG. 2 is a schematic circuit diagram of a steering circuit, as used in this invention.

The configuration of a typical steering network is illustrated in FIG. 2. The A phase steering circuit 28 illustrated in FIG. 2 receives bit 0 and bit 4 data from data registers 14 and 16 respectively. The AB register 22 supplies a binary weighted 4 bit that reverses in polarity for each half byte cycle. When the 4 bit signal is negative, an inverter 38 passes a positive or high signal to an AND gate 40. Data bit 0 is passed through gate 40, to logic OR circuit 44, and provides an output signal to the sample and interleave circuit 36. In accordance with convention, if data bit 0 has a binary 1 value, then a data pulse will be seen by circuit 36. On the other hand, if data bit 0 has a binary 0 value, this will be indicated by the absence of a pulse at the output of the steering circuit 28 and sample circuit 36.

During the half-byte cycle when the polarity of the binary weight 4 bit from the AB register 22 is positive, AND gate 42 is opened to allow data bit 4 from the half-byte data register 16 to pass. Similarly, the binary value of data bit 4 appears at the output of OR gate 44 for subsequent sampling and serial interleaving by circuit 36.

Steering circuits 30, 32 and 34 operate in the same manner as circuit 28. However, steering circuit 30 processes data bits 1 and 5 respectively from data registers 14 and 16 during Phase B time. Steering circuit 32 processes data bits 2 and 6, and circuit 34 receives data bits 3 and 7. Circuits 32 and 34 receive the binary weighted 4 bit from the CD register 24, during Phase C and D times respectively.

The input signals to the network illustrated in FIG. 2 are those required for the steering network 28 which steers Phase A data. Each of the four data steering networks is capable of selecting one of two data bits from the data registers 14 and 16. The bit selected is determined by the value of the count currently stored in the AB or CD registers 22 and 24 which are to be serialized during the Phase A or Phase B times, as shown in FIG. 3. The CD register 24 is similarly used to select data which are to be serially processed during the next Phase C or Phase D times. The AB register 22 and CD register 24 operate in phase quadrature to each other. However, each register changes state at half the rate that would be required of a two phase system if such a system were handling the same data rate as that of the system described herein. The count value in these registers changes once for each four phase revolution of the clock ring.

As shown in FIG. 2, the data bit stored in the Bit 0 position of the data register is selected by the steering network 28 when the AB Register 4 bit is "OFF", and the data bit stored in the Bit 4 position of the data register is selected when the AB register 4 Bit is "ON". The 4 data bits selected by the data steering networks are called Phase A data, Phase B data, Phase C data, and Phase D data. The outputs of the steering networks are sampled by an appropriate clocking pulse (i.e., "Sample A" is used to sample Phase A data) and the four data streams are interleaved to form the serial data stream.

Figure 4:
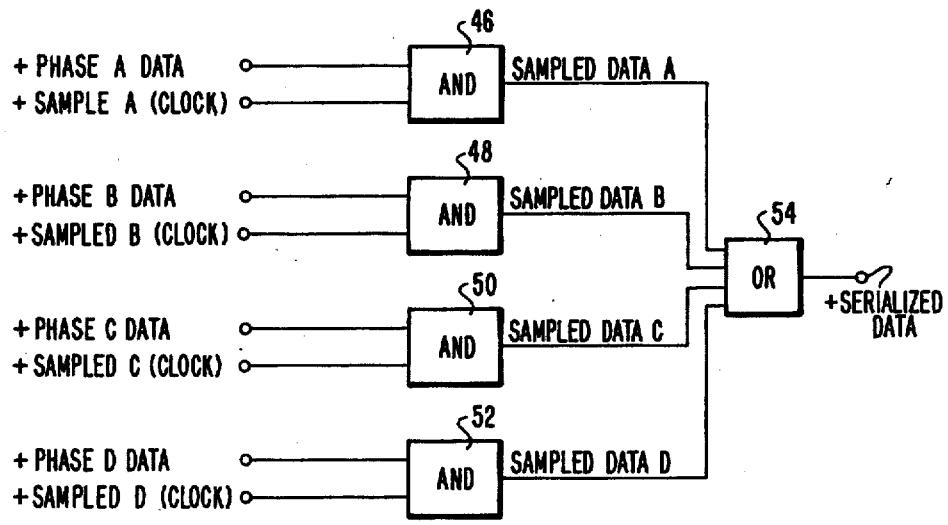
FIG. 4 is a schematic block circuit diagram of a sampling and interleaving circuit, as employed in the embodiment of this invention.

The sample and interleave circuit 36 is shown in FIG. 4. The sampling pulses for adjacent pulses are designed to slightly overlap with respect to time, as previously mentioned, so that switching hazards will not occur in the serial output data stream.

It should be noted that the A Phase and B Phase data at the output of the steering networks 28 and 30 are timewise in parallel relation to each other. Similarly, the C Phase and D Phase data at the output of the steering networks 32 and 34 are in parallel relation to each other. However, the two parallel groups of data, A Phase-B Phase and C Phase-D Phase are in two phase quadrature.

The sample and interleave circuit 36 receives phase data A, B, C and D from the steering circuits 28, 30, 32, 34 in a two-bit-parallel, serial-two-phase fashion, as described supra. As shown in FIG. 4, the phase data A, B, C, D are applied respectively to AND gates 46, 48, 50 and 52. The clock sample pulses A, B, C, D from clock ring 12 are cyclically applied to the AND gates 46–52 to pass serially the data seen at the inputs of the gates 46–52. The serial data is fed through logic OR 54 where the serial data bits are interleaved. The serial data at the output of logic OR 54 is available for further utilization.

By virtue of providing timing control registers for half-bytes of parallel stored data, and phase control to serialize the data, a simplified and relatively inexpensive parallel-to-serial converter may be realized.

In this embodiment, data in parallel in groups are serially sampled by a number of sample pulses equal to the number of data bits in each group. It is apparent that the invention is not limited to a specific number of data bits in any parallel group, or to any number of parallel groups.

Having thus described my invention, what I claim as new, and desire to secure by Letters Patent is:

1. A parallel-to-serial binary data converter comprising:
    first and second data registers for alternately storing first and second groups of binary data bits, said two groups of data bits forming a data byte;
    a multiplicity of steering circuits coupled to said data registers for processing selected data bits received from said data registers;
    a counter for providing phase signals to said steering circuits so that said selected data bits are passed to the outputs of said steering circuits during different phases assigned to different data bits;
    a clock ring for providing clock pulses to said counter for controlling the timing of said phase signals generated by said counter; and
    a sample circuit for cyclically receiving data bits from said steering circuits in phased progression and for serializing said data bits, and for receiving sample timing pulses from said clock ring related to said phase signals from said counter.

2. A parallel-to-serial binary data converter as in claim 1, wherein said groups of data bits are half-bytes of data stored in each of said data registers.

3. A parallel-to-serial binary data converter as in claim 1, wherein each steering circuit is coupled to each data register, and is adapted to process one selected data bit from each register.

4. A parallel-to-serial binary data converter as in claim 1, wherein said counter comprises two registers responsive to said clock ring for producing defined successive phase signals, each phase signal capable of activating a respective steering circuit.

5. A parallel-to-serial binary data converter as in claim 4, wherein said phase signals are in quadrature relationship.

6. A parallel-to-serial binary data converter as in claim 1, further including an incrementing circuit coupled in a closed loop with said counter registers.

7. A parallel-to-serial binary data converter as in claim 1, further including control logic means for loading half-bytes of data from a data source into said data registers.

* * * * *